(12) United States Patent
Yang et al.

(10) Patent No.: US 12,484,183 B2
(45) Date of Patent: Nov. 25, 2025

(54) STRUCTURE FOR IDENTIFYING POSITION OF SERVER IN RACK AND SERVER SYSTEM

(71) Applicant: Fulian Precision Electronics (Tianjin) Co., LTD., Tianjin (CN)

(72) Inventors: Bin-Bin Yang, Tianjin (CN); Xing-Chuan Li, Tianjin (CN); Rui-Hao Xiao, Tianjin (CN); Liang Gao, Tianjin (CN); Fang-Xing Yang, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 165 days.

(21) Appl. No.: 18/507,323

(22) Filed: Nov. 13, 2023

(65) Prior Publication Data

US 2024/0381563 A1    Nov. 14, 2024

(30) Foreign Application Priority Data

May 9, 2023    (CN) .......................... 202310518382.6

(51) Int. Cl.
*H05K 7/14*    (2006.01)
(52) U.S. Cl.
CPC .................................. *H05K 7/1498* (2013.01)

(58) Field of Classification Search
CPC ........................... H05K 7/1498; H05K 7/1492
See application file for complete search history.

(56) References Cited

U.S. PATENT DOCUMENTS

2024/0088612 A1\* 3/2024 Liu ...................... H01R 25/162

FOREIGN PATENT DOCUMENTS

CN    218448491 U  \*  2/2023

\* cited by examiner

*Primary Examiner* — James Wu
(74) *Attorney, Agent, or Firm* — ScienBiziP, P.C.

(57) ABSTRACT

A structure for identifying the position of a server in a rack, the structure includes a busbar, a shell, and a clip. The busbar and the shell mounted in the rack. The shell defines some connecting positions, each connecting positions defines some hole-points, the shell can define a hole at each hole-point, and the quantity and the locations of the holes in each connecting position is different. The clip is connected on the server, the clip includes some springs, when the server is positioned on one of the connecting positions, the spring conductively contacts the shell through the corresponded hole-point without the hole or does not contact the shell through the corresponded hole-point with the hole, the springs are configured for identifying the combination of the connecting position where the server locates to identify the position of the server. A server system using the structure is also disclosed.

14 Claims, 5 Drawing Sheets

STRUCTURE FOR IDENTIFYING POSITION OF SERVER IN RACK AND SERVER SYSTEM

FIELD

The disclosure herein generally relates to information handling systems, and more particularly relates to a structure for identifying the position of a server in a rack and a server system.

BACKGROUND

In a current server system, a plurality of servers are installed in the rack. When one of these servers malfunctions or needs to be repaired or replaced, locating the specific server may be difficult because a position of each server may be difficult to identify. Such a server system may operate with a low efficiency.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
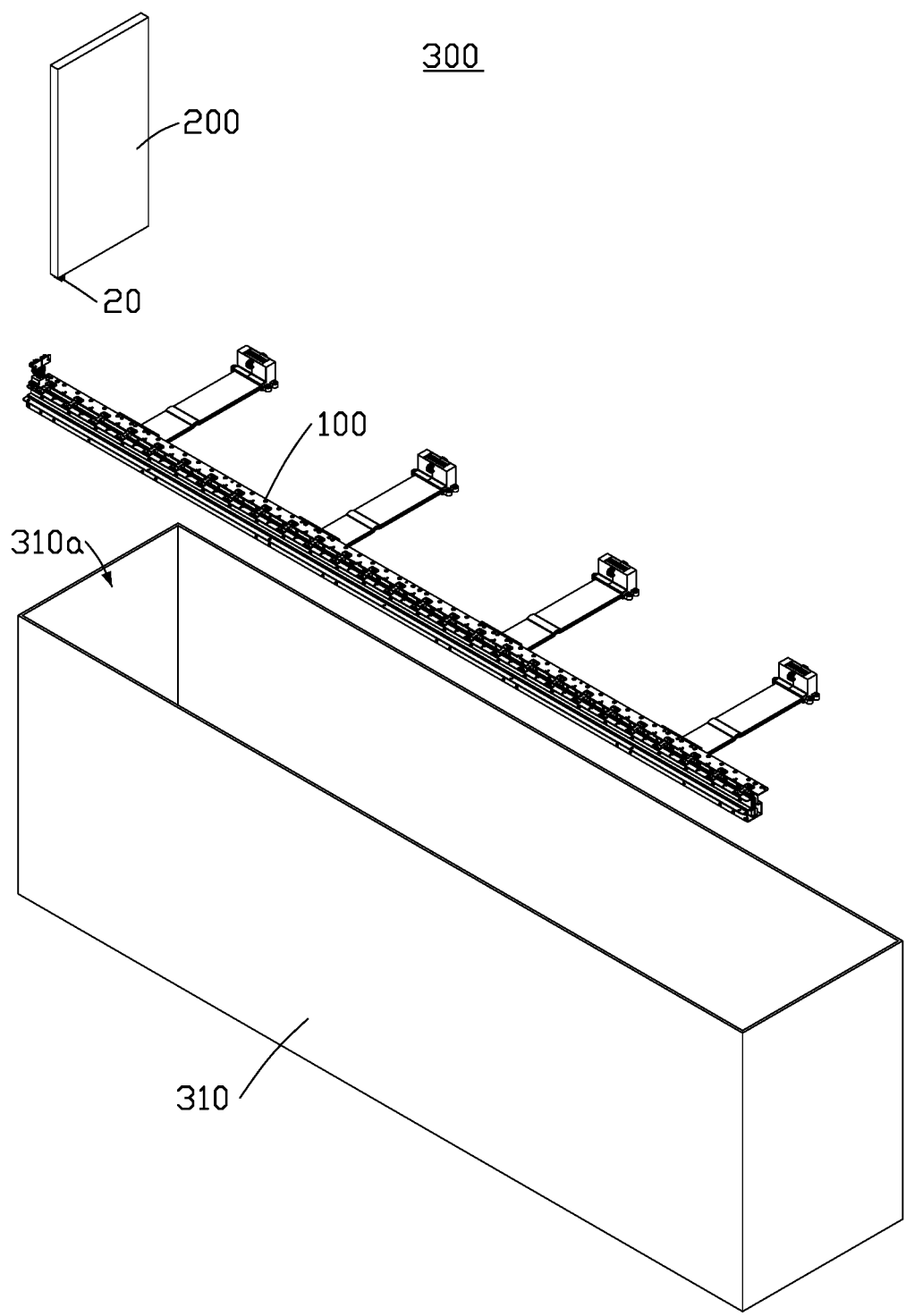
FIG. 1 is an isometric view of a server system according to an embodiment of the present disclosure.
Figure 2:
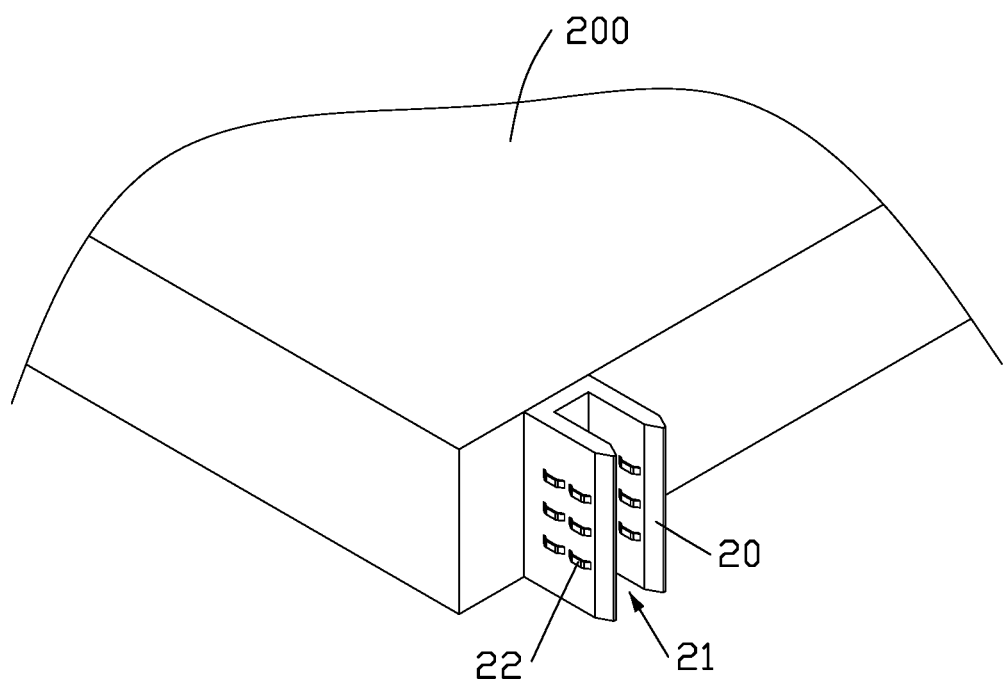
FIG. 2 is an isometric view of the server in FIG. 1.
Figure 3:
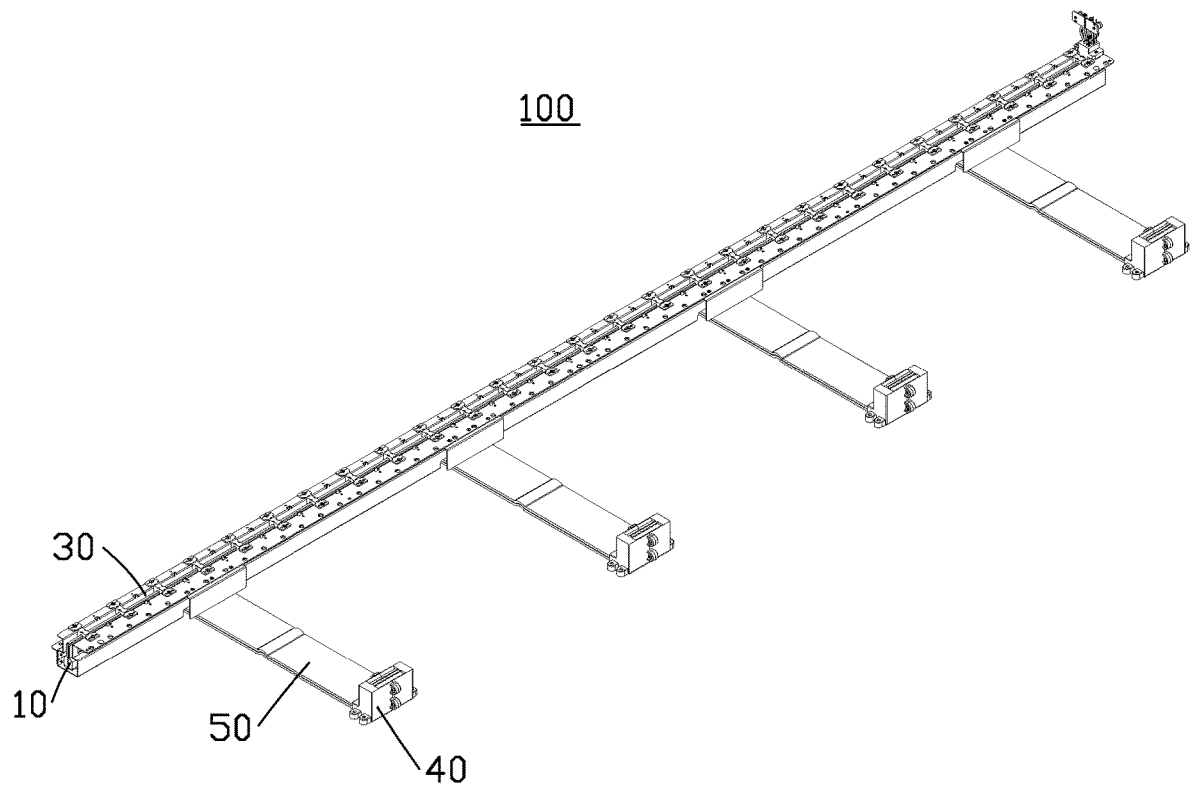
FIG. 3 is an isometric view of a structure of the server in FIG. 1.
Figure 4:
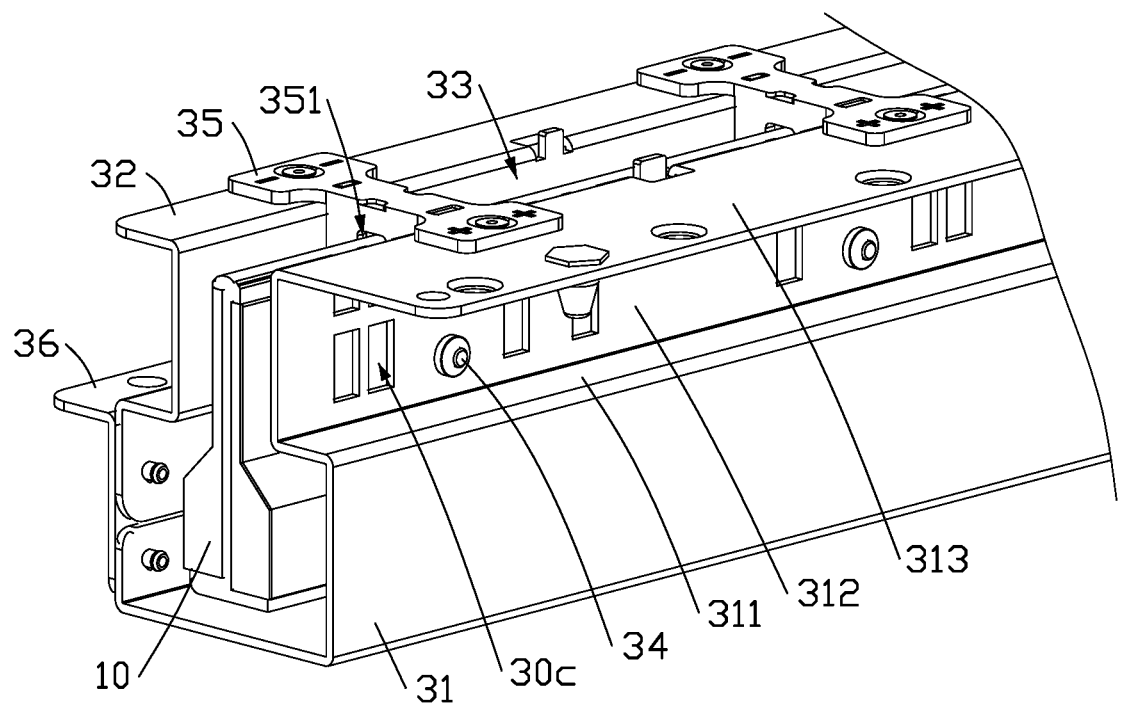
FIG. 4 is another isometric view of the structure in FIG. 3.
Figure 5:
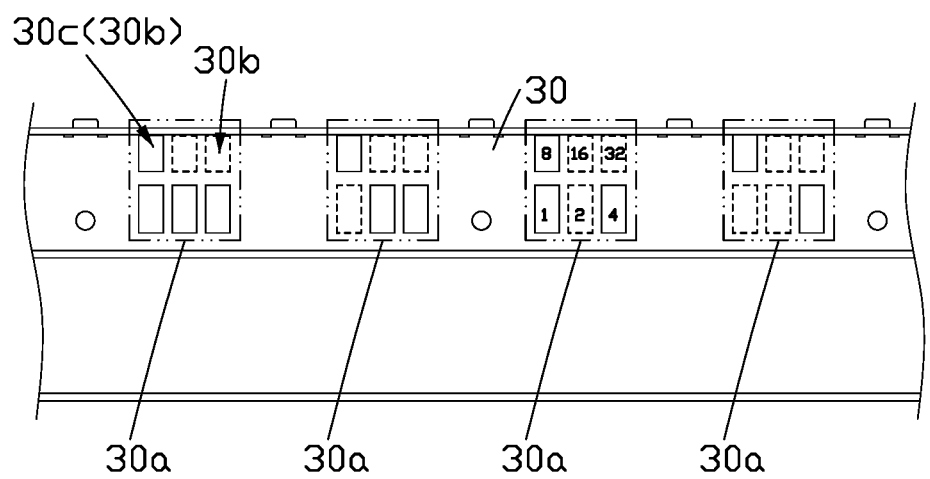
FIG. 5 is a side view of connecting positions in FIG. 4.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1 to FIG. 5, a structure 100 for identifying the position of a server 200 in a rack 310 in an embodiment includes a busbar 10 and a clip 20. The busbar 10 is mounted in the rack 310. The busbar 10 is configured for transmitting electronical signals. The clip 20 is mounted on the server 200. When the server 200 is installed in the rack 310, the clip 20 of the server 200 connects to the busbar 10, so the server 200 can transmit electronical signals with the busbar 10.

The busbar 10 extends in a direction X. The clip 20 includes a slot 21 and a plurality of springs 22. The length of the slot 21 is much smaller than the length of the busbar 10. The slot 21 runs through both ends of the clip 20, to allow the busbar 10 to insert into the slot 21, so the server 200 can transmit electronical signals with the busbar 10. The springs 22 are located outside the slot 21 and are located on the side of clip 20 facing away from the busbar 10.

The structure 100 includes a shell 30. The shell 30 extends in the direction X. The length of the shell 30 is greater than or equal to the length of the busbar 10, and the shell 30 can protect the busbar 10.

Since there are a plurality of servers 200 installed in the rack 310, and the plurality of servers 200 are placed side by side, when one of the plurality of servers 200 has a problem or needs to be repaired and replaced, it is difficult to find this server 200, because the position of each server 200 is difficult to identify.

Therefore, for identifying the position of each server 200, the shell 30 defines a plurality of connecting positions 30a arranged in the direction X. Each connecting position 30a is used for holding a clip 20 of a server 200. Each connecting position 30a has the same quantity of hole-points 30b. When server 200 is installed to the rack 310, the busbar 10 is inserted into the slot 21 of the clip 20, meanwhile the clip 20 must be located on the corresponded connecting position 30a, and the springs 22 of the clip 20 are corresponded to the hole-points 30b one to one. The shell 30 can define a hole 30c at each of the hole-points 30b, which means that in each connecting position 30a, it can be that only one hole-point 30b has the hole 30c, or part of the hole-points 30b have the holes 30c, or all of the hole-points 30b have the holes 30c. The hole 30c is used for avoiding the spring 22, which makes the spring 22 not contact the shell 30. On the contrary, the spring 22 conductively contacts the shell 30 if the corresponded hole-point 30b does not has the hole 30c.

When the spring 22 conductively contacts the shell 30, the server 200 will generate electrical signals by the spring 22 of the clip 20 and transmits the electrical signals to the busbar 10. However, when the spring 22 does not contact the shell 30 because of the hole 30c, the spring 22 and the shell 30 are insulated from each other, so server 200 will not generate electrical signals.

Furthermore, the combination of the quantity and the location or the locations of the hole 30c or the holes 30c in each connecting position 30a are different, which makes the combination of each connecting position 30a is unique on the shell 30. The springs 22 are used for identifying the unique combination of the connecting position 30a holding the clip 20, so it is easy to identify which connecting position 30a the server 200 locates on, and if the server 200 in this connecting position 30a needs to be removed from the rack 310, users can find the server 200 quickly by the finding the combination of this connecting position 30a.

For example, the number of the hole-points 30b from each connecting positions 30a is n. The number of the springs 22 on each clip 20 is also n. The hole-points 30b from each connecting positions 30a define the hole 30c or the holes 30c following a binary principle, so the number of connecting positions 30a is $2^n-1$, which means that the number of the servers 200 can be installed in the rack 310 is $2^n-1$.

In some embodiments, n is equal to 6, so each connecting position 30a has 6 hole-points 30b, and there are ($2^6-1=$) 63 connecting positions 30a on the shell 30, and the rack 310 can install 63 servers 200.

Specifically, the 6 hole-points 30b is corresponded to the numbers 1, 2, 4, 8, 16, and 32, respectively. In each connecting position 30a, if only one hole-point 30b has the hole 30c, the number corresponding to the hole-point 30b with the hole 30c is the number of the connecting position 30a, and if more than one hole-points 30b have the holes 30c, the sum of the number corresponding to the hole-points 30b with the holes 30c is the number of the connecting position.

For example, in one of the connecting positions 30a, if only one hole-point 30b has the hole 30c and the hole-point 30b corresponded to the number 1, the number of the connecting position 30a is 1.

For another example, if the two hole-points 30b corresponded to the number 1 and 2 have the holes 30c, the number of the connecting position 30a is (1+2=) 3.

For another example, if the three hole-points 30b corresponded to the number 4, 8, and 32 have the holes 30c, the number of the connecting position 30a is (4+8+32=) 44.

For another example, if all the six hole-points 30b have the holes 30c, the number of the connecting position 30a is (1+2+4+8+16+32=) 63.

In some embodiments, the six hole-points 30b from each connecting positions 30a are arranged in a three-by-two matrix, the six springs 22 of the clip 20 are also arranged in the three-by-two matrix. The three hole-points 30b in the three-by-two matrix are arranged in the direction X to save space.

In some embodiments, the structure 100 further includes at least one connector 40 and at least one cable 50. The cable 50 connects the busbar 10 and the connector 40, and the connector 40 is used for connecting a power source and supply power to the busbar 10 through the cable 50. Furthermore, the busbar 10 includes a positive electrode, a negative electrode, and an insulator between the positive electrode and the negative electrode, and the positive electrode, the negative electrode, and the insulator all extend along direction X. The cable 50 passes through the shell 30 and conductively connects the positive electrode and the negative electrode.

In some embodiments, the shell 30 further includes a first side wall 31 and a second side wall 32, and the first side wall 31 and the second side wall 32 are located on either side of the busbar 10. The first side wall 31 and the second side wall 32 are connected under the busbar 10. An opening 33 is formed between the first side wall 31 and the second side wall 32 above the busbar 10, the opening 33 is used for exposing the busbar 10 to connect the clip 20. The first side wall 31 and the second side wall 32 are metal sheet.

In some embodiments, the holes 30c are defined on the first side wall 31. The first side wall 31 includes a first bending wall 311, a second bending wall 312, and a third bending wall 313 connected in sequence. The first bending wall 311 and the third bending wall 313 are horizontal, and the second bending wall 312 is vertical. The holes 30c are defined on the second bending wall 312. The first bending wall 311 and the third bending wall 313 are located on the same side of the second bending wall 312, and the first bending wall 311 and the third bending wall 313 are located on the side of the second bending wall 312 away from the busbar 10, so the first bending wall 311 and the third bending wall 313 can protect the spring 22.

In some embodiments, the shell 30 further includes a plurality of connecting columns 34, the connecting columns 34 pass through the first side wall 31, the busbar 10, and the second side wall 32. The connecting columns 34 are used for fixing the busbar 10 and the shell 30. The connecting columns 34 are made of insulating material.

In some embodiments, the shell 30 further includes a plurality of fixing pieces 35, each fixing piece 35 connects to the first side wall 31 and the second side wall 32, the fixing pieces 35 are above the busbar 10, the bottom of each fixing piece 35 defines a fixing groove 351, the top of the busbar 10 is inserted into the fixing grooves 351, the fixing pieces 35 are used for fixing the busbar 10 and the shell 30. Furthermore, the top of the fixing piece 35 is provided with positive and negative marks to identify the positive and negative electrodes of the busbar 10.

In some embodiments, the shell 30 further includes a connecting sheet 36, the connecting sheet 36 is used for connecting the first side wall 31 and the second side wall 32.

As shown in FIG. 1, a server system 300 in one embodiment includes the rack 31, a plurality of servers 200, and the structure 100, the rack 310 defines an accommodating space 310a, the accommodating space 310a is used for accommodating the servers 200, the shell 30, and the busbar 10.

In some embodiments, the busbar 10 and shell 30 are located at the bottom of the rack 310, the servers 200 are inserted into the accommodating space 310a in the vertical direction until the clip 20 is connected to the busbar 10.

In some other embodiments, the busbar 10 and the shell 30 are located at the back in the rack 310, the server 200 is inserted into the accommodating space 310a in the horizontal direction until the clip 20 is connected to the busbar 10.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A structure configured for easy identifying a position of a server in a rack, the structure comprising:
    a busbar configured to be mounted in the rack, the busbar extending in a direction X and configured for transmitting electronic signals to the server and receiving electronic signals from the server;
    a shell configured to be mounted in the rack, the shell comprising 63 connecting positions arranged in the direction X, wherein each of the 63 connecting positions defines 6 hole-points, the 6 hole-points of each of the 63 connecting positions are arranged in a three-by-two matrix, each of the 6 hole-points of each of the 63 connecting positions corresponds to numbers 1, 2, 4, 8, 16, and 32, respectively, each of the 63 connecting positions defines at least one hole and each of the at least one hole is defined at each of the 6 hole-points of each of the 63 connecting positions, in each of the 63 connecting positions, a sum of the numbers corresponding to the hole-point or the hole-points with the at least one hole is a number of the connecting position, the numbers of the 63 connecting position are defined from 1 to 63; and a clip connected to the server, the clip defining a slot and comprising 6 springs, wherein the 6 springs of the clip are arranged corresponding to the three-by-two matrix, when the server is mounted on the rack, one of the 63 connecting positions accommodates the server, the busbar is inserted into the slot to connect the server, and each of the 6 hole-points of the corresponding connecting position where the server is accommodated corresponds to a corresponding one of the 6 springs of the clip, each of the 6 springs is conductively in contact with the shell through the corresponding hole-point without the at least one hole, and each of the 6 springs is not in contact with the shell through the corresponding hole-point with the at least one hole, the 6 springs are configured for identifying the number of the corresponding connecting positions where the server is accommodated to identify the position of the server;

the shell further comprises a first side wall and a second side wall, the first side wall and the second side wall are located on either sides of the busbar, the first side wall and the second side wall are connected under the busbar, an opening is defined between the first side wall and the second side wall and above the busbar, the opening is configured for exposing the busbar to connect to the clip, the hole-points are defined on the first side wall;

the shell further comprises a plurality of connecting columns, the plurality of connecting columns extends through each of the first side wall, the second side wall, and the busbar, each of the plurality of connecting columns comprises two ends, each of the two ends connects to the first side wall and the second side wall, respectively, the plurality of connecting columns are configured for fixing the busbar to the shell;

the shell further comprises a plurality of fixing pieces, each of the plurality of fixing pieces connects to the first side wall and the second side wall, the plurality of fixing pieces are above the busbar, a bottom of each of the plurality of fixing pieces, facing the busbar, defines a fixing groove, a top of the busbar is inserted into the fixing grooves, the plurality of fixing pieces are configured for fixing the busbar to the shell.

2. The structure of claim 1, wherein the structure further comprises a connector and a cable, the cable connects the busbar and the connector, the connector is configured for connecting a power source and supplying power to the busbar through the cable.

3. The structure of claim 2, wherein the busbar comprises a positive electrode, a negative electrode, and an insulator between the positive electrode and the negative electrode, the positive electrode, the negative electrode, and the insulator extend along the direction X, the cable passes through the shell and conductively connects the positive electrode and the negative electrode.

4. The structure of claim 1, wherein the first side wall and the second side wall are metal sheet.

5. The structure of claim 1, wherein the first side wall includes a first bending wall, a second bending wall, and a third bending wall connected in sequence, the first bending wall and the third bending wall are horizontal, and the second bending wall is vertical, the at least one hole are defined on the second bending wall, the first bending wall and the third bending wall are located on the same side of the second bending wall, and the first bending wall and the third bending wall are located on the side of the second bending wall away from the busbar.

6. The structure of claim 1, wherein the shell further includes a connecting sheet, the connecting sheet is configured for connecting the first side wall and the second side wall.

7. The structure of claim 1, wherein a three hole-points in the three-by-two matrix are arranged in the direction X.

8. A server system comprising:
a rack defining an accommodating space;
63 servers located in the accommodating space; and
a structure configured for identifying a position of each of the 63 servers in the rack;
wherein the structure comprises:
a busbar configured to be mounted in the rack, the busbar extending in a direction X and configured for transmitting electronic signals to the 63 servers and receiving electronic signals from the 63 servers;
a shell configured to be mounted in the rack, the shell comprising 63 connecting positions arranged in the direction X, wherein each of the 63 connecting positions defines 6 hole-points, the 6 hole-points of each of the 63 connecting positions are arranged in a three-by-two matrix, each of the 6 hole-points of each of the 63 connecting positions corresponds to numbers 1, 2, 4, 8, 16, and 32, respectively, each of the 63 connecting positions defines at least one hole and each of the at least one hole is defined at each of the 6 hole-points of each of the 63 connecting positions, in each of the 63 connecting positions, a sum of the numbers corresponding to the hole-point or the hole-points with the at least one hole is a number of the connecting position, the numbers of the 63 connecting position are from 1 to 63; and
63 clips, wherein each of the 63 clips is connected to each of the 63 servers, each of the 63 clips defines a slot and comprises 6 springs, the 6 springs of each of the 63 clips are arranged corresponding to the three-by-two matrix, when one of the 63 servers is mounted on the rack, one of the 63 connecting positions accommodates the one of the 63 servers, the busbar is inserted into the slot to connect the one of the 63 servers, and each of the 6 hole-points of the corresponding connecting position where the one of the 63 servers is accommodated corresponds to a corresponding one of the 6 springs of the corresponding clip, each of the 6 springs is conductively in contact with the shell through the corresponding hole-point without the at least one hole, and each of the 6 springs is not in contact with the shell through the corresponding hole-point with the at least one hole, the 6 springs are configured for identifying the number of the corresponding connecting positions where the one of the 63 servers is accommodated to identify the position of the one of the 63 servers;
the shell further comprises a first side wall and a second side wall, the first side wall and the second side wall are located on either side of the busbar, the first side wall and the second side wall are connected under the busbar, an opening is defined between the first side wall and the second side wall and above the busbar, the opening is configured for exposing the busbar to connect to the 63 clips, the hole-points are defined on the first side wall;

the shell further comprises a plurality of connecting columns, the plurality of connecting columns extends through each of the first side wall, the second side wall, and the busbar, each of the plurality of connecting columns comprises two ends, each of the two ends connects to the first side wall and the second side wall, respectively, the plurality of connecting columns are configured for fixing the busbar to the shell;

the shell further comprises a plurality of fixing pieces, each of the plurality of fixing pieces connects to the first side wall and the second side wall, the plurality of fixing pieces are above the busbar, a bottom of each of the plurality of fixing pieces, facing the busbar, defines a fixing groove, a top of the busbar is inserted into the fixing grooves, the plurality of fixing pieces are configured for fixing the busbar to the shell.

9. The server system of claim 8, wherein the structure further comprises a connector and a cable, the cable connects the busbar and the connector, the connector is configured for connecting a power source and supplying power to the busbar through the cable.

10. The server system of claim 9, wherein the busbar comprises a positive electrode, a negative electrode, and an insulator between the positive electrode and the negative electrode, the positive electrode, the negative electrode, and the insulator extend along the direction X, the cable passes through the shell and conductively connects the positive electrode and the negative electrode.

11. The server system of claim 8, wherein the first side wall and the second side wall are metal sheet.

12. The server system of claim 8, wherein the first side wall includes a first bending wall, a second bending wall, and a third bending wall connected in sequence, the first bending wall and the third bending wall are horizontal, and the second bending wall is vertical, the at least one hole are defined on the second bending wall, the first bending wall and the third bending wall are located on the same side of the second bending wall, and the first bending wall and the third bending wall are located on the side of the second bending wall away from the busbar.

13. The server system of claim 8, wherein the shell further includes a connecting sheet, the connecting sheet is configured for connecting the first side wall and the second side wall.

14. The server system of claim 8, wherein a three hole-points in the three-by-two matrix are arranged in the direction X.

* * * * *